United States Patent
Guliani et al.

(10) Patent No.: US 9,543,005 B2
(45) Date of Patent: Jan. 10, 2017

(54) MULTISTAGE MEMORY CELL READ

(71) Applicant: Intel Corporation, Santa Clara, CA (US)

(72) Inventors: Sandeep K Guliani, Folsom, CA (US); Kiran Pangal, Fremont, CA (US); Balaji Srinivasan, Hillsboro, OR (US); Chaohong Hu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/846,898

(22) Filed: Sep. 7, 2015

(65) Prior Publication Data

US 2016/0217853 A1    Jul. 28, 2016

Related U.S. Application Data

(63) Continuation of application No. 14/295,512, filed on Jun. 4, 2014, now Pat. No. 9,165,647.

(51) Int. Cl.
| | |
|---|---|
| *G11C 13/00* | (2006.01) |
| *G11C 7/00* | (2006.01) |
| *G11C 13/02* | (2006.01) |
| *G11C 8/08* | (2006.01) |
| *G11C 16/26* | (2006.01) |
| *G11C 11/16* | (2006.01) |
| *G11C 8/14* | (2006.01) |

(Continued)

(52) U.S. Cl.
CPC ............ *G11C 13/004* (2013.01); *G11C 8/08* (2013.01); *G11C 8/14* (2013.01); *G11C 11/16* (2013.01); *G11C 11/1653* (2013.01); *G11C 11/1655* (2013.01); *G11C 11/1657* (2013.01); *G11C 11/1673* (2013.01); *G11C 13/0002* (2013.01); *G11C 13/0004* (2013.01); *G11C 13/0023* (2013.01); *G11C 13/0026* (2013.01); *G11C 13/0028* (2013.01); *G11C 7/00* (2013.01); *G11C 11/419* (2013.01); *G11C 11/5678* (2013.01); *G11C 13/003* (2013.01)

(58) Field of Classification Search
CPC ............... G11C 13/0004; G11C 13/004; G11C 11/5678; G11C 13/003; G11C 13/0028; G11C 11/419; G11C 7/00; G11C 8/08
USPC .... 365/163, 189.15, 185.18, 185.19, 185.21, 365/185.23, 185.24, 185.25
See application file for complete search history.

(56) References Cited

U.S. PATENT DOCUMENTS

| | | |
|---|---|---|
| 7,408,833 B2 | 8/2008 | Rehm et al. |
| 2006/0126380 A1 | 6/2006 | Osada et al. |

(Continued)

OTHER PUBLICATIONS

Organized Translation of "Notice of Reasons for Rejection" App. No. 2015-084040, Mailed May 10, 2016, 1 page.

*Primary Examiner* — Ly D Pham
(74) *Attorney, Agent, or Firm* — Compass IP Law

(57) ABSTRACT

A multistage read can dynamically change wordline capacitance as a function of threshold voltage of a memory cell being read. The multistage read can reduce current spikes and reduce the heating up of a memory cell during a read. A memory device includes a global wordline driver to connect a wordline of a selected memory cell to the sensing circuit, and a local wordline driver local to the memory cell. After the wordline is charged to a read voltage, control logic can selectively enable and disable a portion or all of the global wordline driver and the local wordline driver in conjunction with applying different discrete voltage levels to the bitline to perform a multistage read.

22 Claims, 6 Drawing Sheets

(51) Int. Cl.
    *G11C 11/419*     (2006.01)
    *G11C 11/56*     (2006.01)

(56) References Cited

U.S. PATENT DOCUMENTS

| | | |
|---|---|---|
| 2006/0209616 A1 | 9/2006 | Kim et al. |
| 2008/0062741 A1 | 3/2008 | Choi et al. |
| 2008/0080229 A1 | 4/2008 | Choi et al. |
| 2008/0247235 A1* | 10/2008 | Kang .................. G11C 16/20 365/185.18 |
| 2009/0161418 A1 | 6/2009 | Yoon |
| 2011/0297912 A1 | 12/2011 | Samachisa et al. |
| 2014/0209892 A1* | 7/2014 | Kuo .................. G11C 8/10 257/43 |

\* cited by examiner

MULTISTAGE MEMORY CELL READ

RELATED APPLICATION

This patent application is a Continuation of, and claims the benefit of priority of, U.S. patent application Ser. No. 14/295,512, filed Jun. 4, 2014.

FIELD

Embodiments of the invention are generally related to memory devices, and more particularly to applying different voltage levels in different stages to read memory cells.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2014, Intel Corporation, All Rights Reserved.

BACKGROUND

Computing devices rely on storage devices to store code and data used in the computing devices. Certain memory devices are byte addressable, with memory cells between wordlines and bitlines. With some memory cell technologies, reading the memory cell can cause unintentional changes to the contents of the memory device (referred to as cell disturb). More particularly, the current associated with reading a memory cell can cause a memory device to heat up and cause instability to stored data, as well as using more power. There is a certain amount of current that is necessary to be able to read the memory cell. It will be understood that even best known semiconductor processing techniques result in operations and performance variations both within a memory device as well as from device to device. The traditional approach to read voltage levels typically targets worst case current at the expense of lower sense margins. While current could be increased to improve the sense margins, increasing the current has the negative effects of increasing power consumption as well as causing increased cell disturb. Thus, the traditional approach tends to trade off between sense margin and cell disturb, which can negatively affect read performance.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
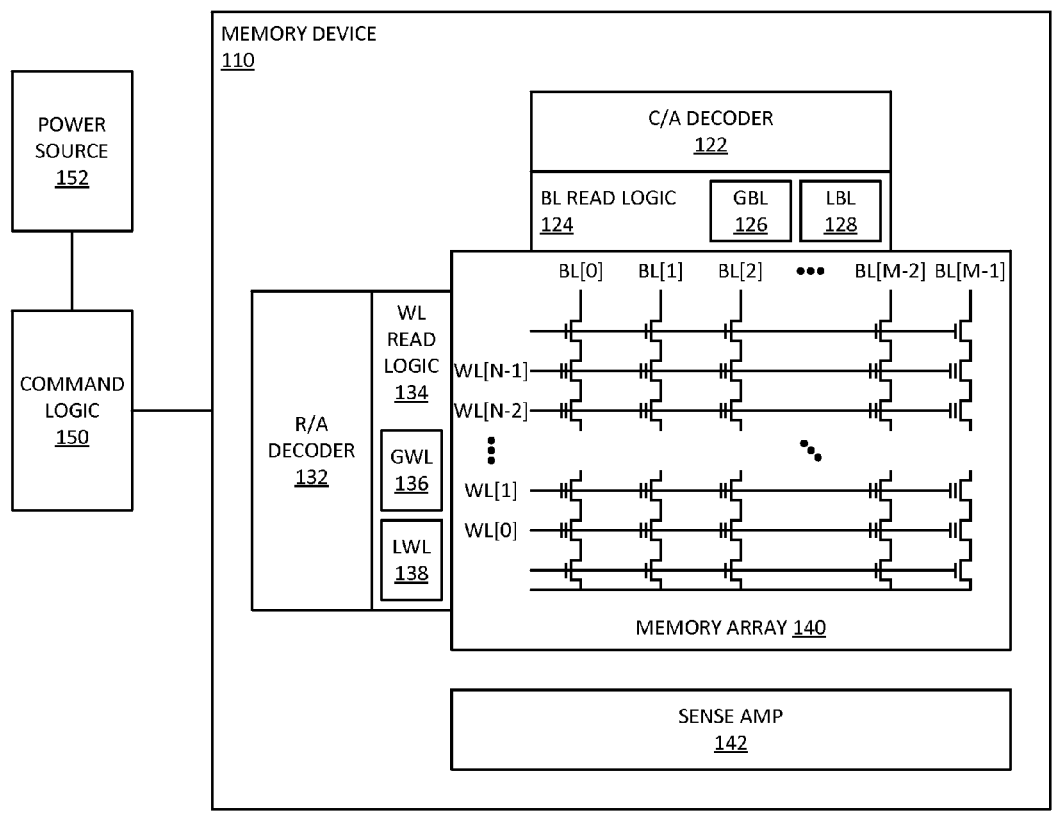
FIG. 1 is a block diagram of an embodiment of a system having a memory device in which a multistage read operation is executed.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a multistage read (which could also be referred to as a multistep read) can reduce current spikes and reduce the heating up of a memory cell during a read operation. A memory device includes a global wordline driver to connect wordlines to a sensing circuit, and local wordline drivers local to a selected memory cell. The wordline drivers can charge the selected wordline to a read voltage in preparation for a bitline voltage applied to the bitline of the selected memory cell. The global wordline driver and local wordline drivers selectively connect the wordline of a selected memory cell to the sensing circuit to charge the sensing circuit from the selected memory cell after applying one or more bitline voltage levels. Control logic can selectively enable and disable portions of the global wordline driver and/or the local wordline driver in conjunction with applying different discrete voltage levels to the bitline to perform a multistage read. The control logic can control the capacitance for a read stage by controlling the portions of the global wordline path and by controlling the local wordline path to be enabled at a particular bitline voltage.

By selectively enabling and disabling the global wordline driver and the local wordline driver from a selected memory cell in conjunction with applying different discrete bitline voltage levels, the control logic can dynamically change wordline capacitance as a function of threshold voltage of the memory cell being read. It will be understood that selectively tapping into the global wordline path at one or more nodes and selectively tapping into the local wordline path can provide different capacitances as seen at the memory cell. Thus, by selectively controlling what node along the path is connected or disconnected from the wordline or memory cell, the control logic can dynamically change the effective capacitance seen by the memory cell during a read. The control logic can reduce the effective capacitance in multiple stages in conjunction with increases in the bitline voltage. Thus, multistage reads can cause reads to be more consistent across process variations, improving the tradeoff between sense margin and cell disturb.

As mentioned above, one traditional approach to memory cell reads is to minimize wordline capacitance to control worst case temperature during reads. However, for memory cells with low voltage thresholds, such a technique results in low sense margins, affecting read performance. While increasing the capacitance can improve sense margins, such capacitance increases tend to increase cell disturb as increased current results. These relationships form the basic issues involved in the tradeoff between sense margin and cell disturb. Traditional worst case approaches select a fixed cell disturb and sense margin tradeoff. A multistage read uses multiple stages to dynamically alter the mechanisms that control the tradeoff.

A multistage read can be implemented in accordance with the following. The control logic charges a wordline to a voltage level that supports a read of the memory cell. The expression control logic is used generically to refer to decode logic and/or logic that operates the drivers responsible for the read sensing if considered separate from the decode logic. As described herein, the control logic can selectively control the drivers at different nodes along the wordline path. The control logic can include logic that controls the operation of the bitline as well as logic that controls the operation of the wordline. It will be understood that the bitline logic can further be considered to separate global bitline and local bitline control, as well as global wordline and local wordline control. Global bitline and global wordline refer, respectively, to drivers and/or other circuitry that apply to a group of bitlines or wordlines. Local bitline and local wordline refer, respectively, to drivers and/or other circuitry that apply to specific bitlines or wordlines. The wordline and/or bitline refer to a conductor that extends across many (e.g., dozens, hundreds, or thousands) of memory cells. As used herein, a wordline path can refer to the path connecting drivers to the wordline and/or the path connecting the drivers to the wordline plus the wordline itself. The specific voltage levels used by the control logic to charge the wordline and/or the voltage of the bitline will depend on the system implementation as well as the memory technology used for the system implementation. The value of the voltage to which to charge the wordline will vary by implementation, as will be understood by those skilled in the art. The value of the wordline voltage can be based on a level needed to provide a good reading at an initial bitline voltage (e.g., based on the architecture of the sensing circuit). The multistage read increases the bitline voltage in conjunction with changing the effective wordline capacitance as seen at the memory cell. Each stage of the multistage read can be considered to have a specific bitline voltage level that corresponds to a wordline capacitance. The bitline voltage level is provided by ramping up the bitline to the voltage level. The wordline capacitance is provided by selecting different nodes along the wordline path.

In one embodiment, once the selected wordline is charged, the control logic floats a global wordline, for example, by the control logic deselecting a global wordline driver. In one embodiment, the control logic keeps a local wordline driver selected while floating the wordline from the global driver circuit that connects to a sensing circuit. The control logic then ramps up a bitline voltage to an initial value or initial voltage level. The initial voltage level is lower than the traditional voltage level expected to trigger or threshold the memory cell. In one embodiment, the initial voltage level for the bitline is based on expected distribution of threshold voltages of the memory cells of the memory device. For example, there can be a range of voltages expected to trigger memory cells having different threshold voltages based on differences in processing. The initial voltage can be a voltage level expected to cause a certain percentage of devices to threshold (e.g., 50%, 33%, 25%).

It will be understood that reference to a voltage level as described with reference to a multistage read refers to a level to which the control logic charges the bitline. A voltage level is held for at least some period of delay, and is not simply a voltage value that instantaneously or momentarily passed while ramping up to a voltage level. For example, assume a voltage that is estimated to trigger all memory cells is a voltage Vdm, which is higher than the highest expected Vt (threshold voltage). Using a 50% threshold as an example, further assume that 50% of all memory cells are expected to trigger at a voltage Vdm−Vpart, where Vpart represents a voltage step size, where the voltage level Vdm−Vpart will trigger 50% of the memory cells. The control logic can ramp up to an initial voltage of Vinitial=Vdm−Vpart, and hold the voltage level Vinitial for long enough to allow the memory cells to trigger (which can also be referred to as "snapping"). It will be understood that a memory cell will trigger when Vbl−Vwl=Vt, or when the bitline voltage minus the wordline voltage equals the threshold voltage for the memory cell. The control logic can then have a next voltage level for another stage of read that is either Vdm (for a two stage read), or some value between Vdm and Vinitial (for a read that is more than two stages).

In one embodiment, the control logic floats the local wordline by deselecting the local wordline driver after ramping the bitline. In one embodiment, the control logic can further ramp the voltage after deselecting the local wordline driver. The control logic can ramp up the bitline to an end voltage (e.g., Vdm). In one embodiment, more than two stages of read are implemented by "floating" different nodes of the wordline path. Thus, floating the global wordline can refer to one or more stages of global wordline floating, where one or more portions of the global wordline path are selectively disabled. Typically, floating the local wordline refers to floating the local wordline, where the local wordline path is selectively disabled. In one embodiment, once the control logic ramps the bitline to an end voltage, the control logic can then ramp down the bitline voltage in preparation for a read. In one embodiment, the control logic performs the read by selecting the local wordline driver and the global wordline driver to connect the selected memory cell to the sensing circuit. The sensing circuit compares a node to a reference voltage, where the node is typically referred to as HNREG, which is compared to a reference voltage to determine the state of the memory cell. By selecting the wordline drivers, the HNREG node can then charge from the memory cell. It will be understood that floating the global wordline can adjust the wordline capacitance. Thus, floating the wordline and ramping the bitline in stages can reduce the effective capacitance to manage read disturb for memory cells with high Vt, which not affecting sense margin for memory cells with low Vt (which will have already triggered prior to the ramping of the voltage).

In one embodiment, the initial voltage is applied without floating the global wordline. Thus, the first stage of the multistage read can be a no-float read, also known as pseudo-static read. If a first stage is a no-float read, there can be a three stage read by then floating the global wordline in a second stage and floating the local wordline in a third stage, for example. In one embodiment, sensing the HNREG node with the sensing circuit (e.g., a sense amplifier) can be performed multiple times. For example, the control circuit can perform read sensing at each stage of the bitline voltage ramp-up. For a two stage read, the control circuit can sense HNREG twice. In one embodiment, the control circuit only senses HNREG once, after the end bitline voltage is reached. Simulations with certain phase change memory devices indicates that a two stage read followed by sensing at the end of the second bitline voltage stage provided good thermal performance, as well as good sense margin performance and read latency performance. Different technologies may perform differently.

It will be understood that by performing a multistage read, a system designer can more carefully manage the tradeoff between sense margin and memory cell temperature. The multistage read can be used to minimize memory cell temperature while maintaining sense margins similar to what are traditionally achievable. The multistage read can alternatively be used to maximize sense signal during the read without increasing memory cell temperature over what is traditionally achievable. The voltage levels of the different voltage stages can be adjusted based on what outcome is desired (i.e., improved memory cell thermal performance, improved sense margin, or both).

Sense margin is a function of the threshold voltage, Vt, of the memory cell. Thus, a lower cell Vt results in a lower sense margin. The memory cell thresholds, triggers, or snaps during a slow bitline ramp when the voltage across the memory cell equals Vt. After thresholding, the bitline charges the wordline through the memory cell. Since the wordline capacitance is relatively small, the charge sharing happens quickly relative to the time for performing the read, and thus the memory cell shuts off quickly. The higher the Vt, the higher the bitline voltage will be when the memory cell thresholds. Thus, when the Vt is higher, a higher bitline voltage is needed to trigger the memory cell, and the charge shared with the wordline is consequently higher.

Cell temperature is also a function of memory cell Vt, and can cause read disturb. Again, a higher Vt requires a higher bitline voltage to trigger the memory cell. Thus, a higher Vt results in higher peak current through the memory cell, because peak current is equal to voltage across the cell divided by the impedance of the cell. Higher current results in a higher temperature of the memory cell in response to thresholding, and can thus increase the risk of read disturb.

In one embodiment, the multistage read is performed in a next generation memory system, which can be configured as a two-level memory (2LM) system, or a system with two levels of memory. In a 2LM configuration, the hardware platform can include a first level of memory that can be referred to as near memory. In one embodiment, the near memory is implemented as volatile memory. The hardware platform can also include a second level of memory that can be referred to as far memory. In one embodiment, the far memory is implemented as nonvolatile memory. Far memory is larger and slower than near memory, but has a determinate state even if power is interrupted to the memory device. The nonvolatile memory described herein is byte addressable and can be addressed in the same way volatile memory has traditionally been accessed. Near memory can provide a low latency and high bandwidth cache for far memory.

In one embodiment, near memory is managed by a near memory controller (NMC) over a near memory interface (NMI), and far memory is managed by a far memory controller (FMC) over a far memory interface (FMI). In one embodiment, the FMC reports the far memory as main memory to a host operating system that is to execute on the hardware platform. In such an implementation, the near memory can operate as a transparent cache of the far memory, and the host operating system does not need to be separately configured to recognize or address the near memory.

A multistage read can be performed on any of the following memory technologies, which can be byte addressable and used to replace DRAM (dynamic random access memory) as main memory for a system. The memory technologies include, but are not limited to, phase change memory (PCM), three dimensional cross point memory, resistive memory, nanowire memory, ferroelectric transistor random access memory (FeTRAM), magnetoresistive random access memory (MRAM) that incorporates memristor technology, spin transfer torque (STT)-MRAM, or other byte addressable memory device, or a combination.

Details about 2LM systems, near memory, far memory, and FM's can be found in U.S. patent application Ser. No. 12/976,545, filed Dec. 22, 2010, entitled "Two-Level System Main Memory," and assigned to the same corporate entity as the present patent application. An embodiment of a 2LM system can be implemented in any embodiment of a system described herein. As such, multistage read can be performed on a far memory technology in accordance with any embodiment described herein.

FIG. 1 is a block diagram of an embodiment of a system having a memory device in which a multistage read operation is executed. System 100 represents a system in which a multistage read is performed. System 100 includes memory device 110, which represents a memory device having memory cells of differing threshold levels. In one embodiment, memory device 110 is a phase change memory device. Memory device 110 can be a byte-addressable nonvolatile memory device.

Memory array 140 includes N wordlines (WL[0] to WL[N−1]). N can be, for example, 32 or 64, although in general the size of array 140 does not affect the ability to improve the tradeoff between sense margin and cell disturb through multistage reads. Array 140 includes M bitlines (BL[0] to BL[M−1]). In one embodiment, memory device 110 includes multiple arrays 140 or multiple banks of memory cells to store data in separately addressable locations. Each memory cell within array 140 is addressed or selected by asserting a wordline and a bitline. C/A (column address) decoder 122 can determine from a received command which bitline or bitlines to assert for a particular command. R/A (row address) decoder 132 can determine from a received command which wordline to assert for the command. In addition to the memory cells depicted, system 100 can include various select lines that enable selection of bitlines, as is understood by those skilled in the art.

In one embodiment, memory device 110 includes bitline read logic 124 and wordline read logic 134. Bitline read logic 124 can be part of C/A decoder 122 and/or considered separate logic circuitry. Bitline read logic 124 includes global bitline logic 126 as well as local bitline logic 128. Similarly, wordline read logic 134 can be part of R/A decoder 132 and/or considered separate logic circuitry. Wordline read logic 134 includes global wordline path logic 136 and local wordline path logic 138. Bitline read logic 124 enables memory device 110 to ramp up the bitline voltage to different discrete voltage levels during a read to perform a multistage read. Wordline read logic 134 enables memory device 110 to selectively enable and disable global and local wordline driver logic (e.g., GWL 136 and LWL 138) to separately float the global wordline and the local wordline to dynamically control the effective capacitance of the memory cell during a read operation. It will be understood that floating the global wordline and floating the local wordline refer to disconnecting the wordline at different nodes along the wordline path, and specifically at the global wordline driver level and at the local wordline driver level. The global and local wordline paths can connect the memory cell to a sensing circuit when both global and local wordline drivers are enabled. When disabled, the wordline is disconnected from the sensing circuit. Thus, floating the global wordline can refer to disconnecting the wordline path at one or more nodes in the global wordline driver logic, and floating the local wordline can refer to disconnecting the wordline at another node in the local wordline driver logic, where the local wordline path is closer to the memory cell than the sensing circuit, and the global wordline path is closer to the sensing circuit than the memory cell. Each node that can be selectively enabled or disabled allows system 100 to apply different capacitance to the wordline as seen at the selected memory cell. More detail for one embodiment of a circuit representation of the drivers and paths is provided below with respect to FIG. 4.

Memory device 110 operates based on power received from power source 152. Power source 152 represents one or more voltage sources or voltage levels generated within system 100 to power electronic components of an electronic device, which can include system 100. Power source 152 can provide different voltage levels for a read operation in memory device 110. It will be understood that the specific voltage levels of the different read stages will depend on device-specific characteristics and design, and thus can differ for devices from different manufacturers.

Command logic 150 represents hardware and/or logic by which memory device 110 receives a read command within system 100. In one embodiment, command logic 150 also provides one or more read voltage levels to memory device 110. Command logic 150 typically receives the read command from a host processor (not shown). In one embodiment, command logic 150 is part of the host processor, or part of a system on a chip that contains the host processor. In one embodiment, command logic 150 is part of memory device 110. The read command or commands cause system 100 to perform a read operation for one or more memory cells of memory array 140.

In one embodiment, command logic 150 provides the read command to the memory device, and the memory device provides ramped up voltages for the selected bitline for the read operation. In one embodiment, power source 152 provides an operational voltage to memory array 140 and the decoding and read logic circuitry, and the read logic circuitry (124 and 134) create the different voltage levels for the different stages of the read operation. The control logic of wordline sense logic 134 and bitline read logic 124 provide the different levels of voltage to memory array 140 during the read operation, as well as controlling the different read operation stages. The read operation stages can be controlled by controlling the timing of signaling within the control logic to apply different voltages and to connect and disconnect the selected wordline.

In general, command logic 150 receives and/or generates a read command to be performed by memory device 110 on one or more memory cells within memory array 140. C/A decoder 122 and R/A decoder 132 determine which wordline and bitline intersect at a selected memory cell to read. Wordline read logic 134 charges the selected wordline, which can include selecting or enabling a global wordline driver 136 and local wordline driver 138 to charge the wordline. In one embodiment, after charging the selected wordline, logic 134 can disable global wordline driver 136 while maintaining enabled local wordline driver 138. The selected memory cell can then be said to be in a state where the global wordline is floating. While the global wordline is floating, bitline read logic 124 can ramp up the selected bitline voltage to a first stage voltage level, which should trigger the selected memory cell if it has a low Vt. In one embodiment, bitline read logic 124 can ramp up the bitline voltage to one or more other discrete stage voltage levels to trigger the memory cell based on the Vt, with corresponding deselecting of one or more other nodes along the global wordline path.

In one embodiment, after bitline read logic 124 ramps up the selected bitline to a first or more bitline voltage level stages, wordline read logic 134 can disable local wordline driver 138 to float the local wordline. It will be understood that wordline read logic 134 can maintain global wordline driver 136 disabled when disabling local wordline driver 138, resulting in both drivers being disabled. In one embodiment, after wordline read logic 134 floats the local wordline, bitline read logic 124 applies a higher voltage level to the selected bitline. If the selected memory cell has a higher Vt, the memory cell should be triggered during a higher bitline voltage stage or phase. With the wordline floating, the effective capacitance is reduced, and the current spike through the memory cell can appear somewhat normalized whether it has a high Vt or a low Vt.

In one embodiment, bitline read logic 124 then ramps down the voltage on the selected bitline. Wordline read logic 134 can enable global wordline driver 136 and local wordline driver 138 to connect the selected memory cell to the sensing circuit (represented by sense amp 142) to read the selected memory cell. In one embodiment, wordline read logic 134 enables the wordline drivers for more than one read operation stage, instead of only once at the end of all bitline voltage level stages. In one embodiment, wordline read logic 134 does not disable the global wordline prior to a first ramp-up of the bitline voltage by bitline read logic 124.

Figure 2:
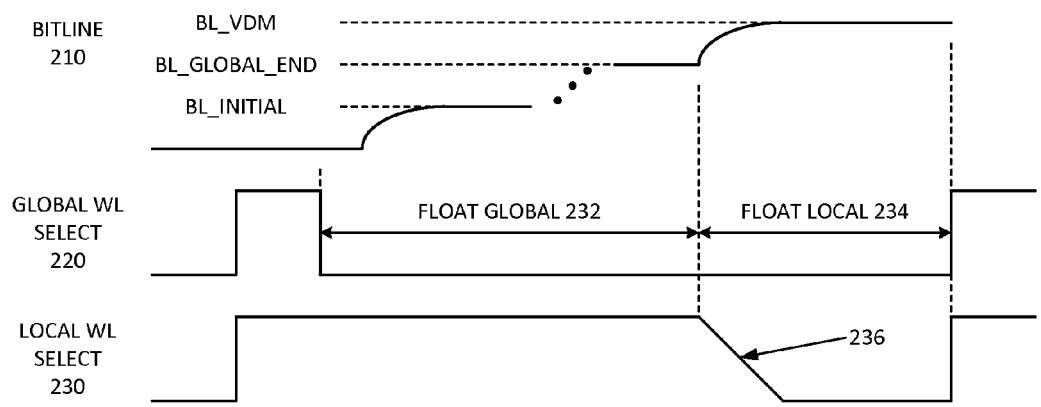
FIG. 2 is a diagrammatic representation of an embodiment of voltage waveforms in a system that performs a multistage read operation.

FIG. 2 is a diagrammatic representation of an embodiment of voltage waveforms in a system that performs a multistage read operation. Diagram 200 represents various signals associated with a multistage read operation. System 100 can be one example of a system that performs a multistage read that can have signals similar to those depicted in diagram 200. Specific signals shown are bitline 210, global wordline select (GWLS) 220, and local wordline select (LWLS) 230. It will be understood that additional signals that are not shown can also be used to perform the desired multistage read. GWLS 220 represents a signal used to enable and disable a global wordline driver, while LWLS 230 represents a signal used to enable and disable a local wordline driver. In one embodiment, one or more additional signal lines can be used to partially enable and disable the global wordline driver and one or more additional signal lines can be used to enable and disable the local wordline driver. Partially enabling or disabling the global wordline refers to activating or deactivating a device along the global wordline path for the global wordline driver.

In one embodiment, the various stages of the multistage read, where bitline 210 is driven to different voltage levels, correspond to the timing of signals on GWLS 220 and LWLS 230. Control logic charges a wordline to a voltage level determined to support a read of a memory cell, given the architecture and expected performance of the memory cells (e.g., a range of Vt expected for the memory cells and voltage levels to use on the bitline). In one embodiment, after charging the wordline, the control logic enables a global wordline driver and a local wordline driver by signals on GWLS 220 and LWLS 230, respectively. The control logic charges bitline 210 to BL_Initial after charging up the wordline. While not explicitly shown, the wordline can be charged to a value of WL_Vdm, which is a voltage level based on expected threshold voltage distribution of the memory cells.

The control logic can also control the timing of deselecting or disabling the wordline drivers. As illustrated, in one embodiment, the control logic disables the global wordline driver by deselecting the global wordline select signal 220. Diagram 200 represents a generic case, and disabling the global wordline driver can be performed by disabling one or more portions of the global wordline driver at a time. When the global wordline driver is disabled and the local wordline driver is still enabled, the wordline is considered to be floating as to the global wordline node. The floating global wordline period is shown as time period 232 and labeled as "float global," and can refer to all stages of floating the wordline path at the global wordline driver. In one embodiment, the control logic can disable the local wordline driver by deselecting the local wordline select signal 230 at some point in time after floating the global wordline. When the local wordline driver is disabled, the wordline can be considered to be floating as to the local wordline node. The floating local wordline period is shown as time period 234 and labeled as "float local," referring to the stage of floating the wordline path at the local wordline driver. It will be understood that the timing of periods 232 and 234 do not have to be the same amount of time, although they could be. It will also be understood that there could be multiple stages of float global 232 and a single stage of float local 234, or a single stage of float global 232 and a single stage of float local 234.

In one embodiment, the control logic triggers the different wordline float periods in association with triggering ramping the voltage on bitline 210. For illustration purposes, the waveform for bitline 210 represents three different bitline voltage levels: BL_Initial, BL_Global_End, and BL_Vdm. It will be understood that in general a multistage read will have two or more bitline voltage levels. BL_Initial represents an initial voltage applied to the bitline for a first stage of the multistage read, and BL_Vdm represents a final voltage applied to the bitline for the last stage of the multistage read. It will be understood that there can be zero or more additional discrete voltage levels between BL_Initial and BL_Vdm. It will also be understood that the labeling in diagram 200 is merely instructive, and other labeling could be used. Each discrete voltage level between BL_Initial and BL_Vdm corresponds to a different wordline capacitance as provided by different selection of logic in the global wordline driver and/or in the local wordline driver.

The values of BL_Initial, BL_Global_End, and BL_Vdm are based on expected operation of the memory device. In one embodiment, the values are determined based on expectations of the Vt distribution across memory cells in the memory device. Again, Vt distribution occurs naturally based on process variations in the memory cells. In one embodiment, BL_Initial and BL_Global_End are a single value. Thus, there can be two or more phases of bitline voltage. It will be understood that the scale of the voltage levels is not explicitly shown in diagram 200.

BL_Initial is an initial voltage level to which the control logic ramps bitline 210. In one embodiment, the control logic ramps bitline 210 to BL_Initial after deselecting global wordline select 220. In one embodiment, the control logic can generate zero or more additional voltage ramp-ups of bitline 210 during period 232, and deselect other portions of the global wordline driver. BL_Global_End represents the voltage level on bitline 210 at the end of period 232, and can be a starting point for ramping up the voltage during period 234. It will be understood that each voltage level on bitline 210 can be considered one stage of the multistage read. Each voltage level may trigger a memory cell. Thus, the memory cell will be triggered at the lowest bitline voltage necessary to satisfy its specific Vt, which can reduce the amount of current drawn when triggering memory cells for a read.

It will also be understood that floating the wordline from the global wordline path node(s) and the local wordline path separately, the control logic can dynamically change the effective capacitance seen at the memory cell. The system can selectively isolate the memory cell along the global wordline path and the local wordline path to change the capacitance see by the memory cell. By lowering the capacitance seen at the memory cell during the read as the bitline voltage is increased, the current through the memory cell should be substantially the same regardless of the specific Vt for a memory cell.

In one embodiment, the signals for global wordline select 220 and/or for local wordline select 230 (and any other signals that correspond to disabling a portion of a wordline driver) can be intentionally sloped, rather than shutting off quickly. As an example, consider slope 236 in local wordline select 230. Slope 236 can be any shape, and is shown as a linear ramp for simplicity. Additionally, the slope of slope 236 is not necessarily to scale, and could be greater or less than the representation in diagram 200. By gradually turning off the driver or portion of the driver at the same time the bitline voltage is being ramped, it will be understood that a more analog memory cell activation can occur. For example, if the system suddenly shuts off local wordline select 230 just as it begins to ramp bitline 210, memory cells of different Vt will trigger at slightly different places along the bitline ramp, but would each see essentially the same wordline capacitance (and thus the current spikes would be different). Such an effect, while much smaller than with a traditional read, can be further smoothed by ramping down the select line when the bitline is ramped up. Thus, the effective capacitance seen at the memory cell will gradually reduce as bitline 210 is ramped up, which can result in a more uniform current spike regardless of the specific Vt for the memory cell.

Figure 3:
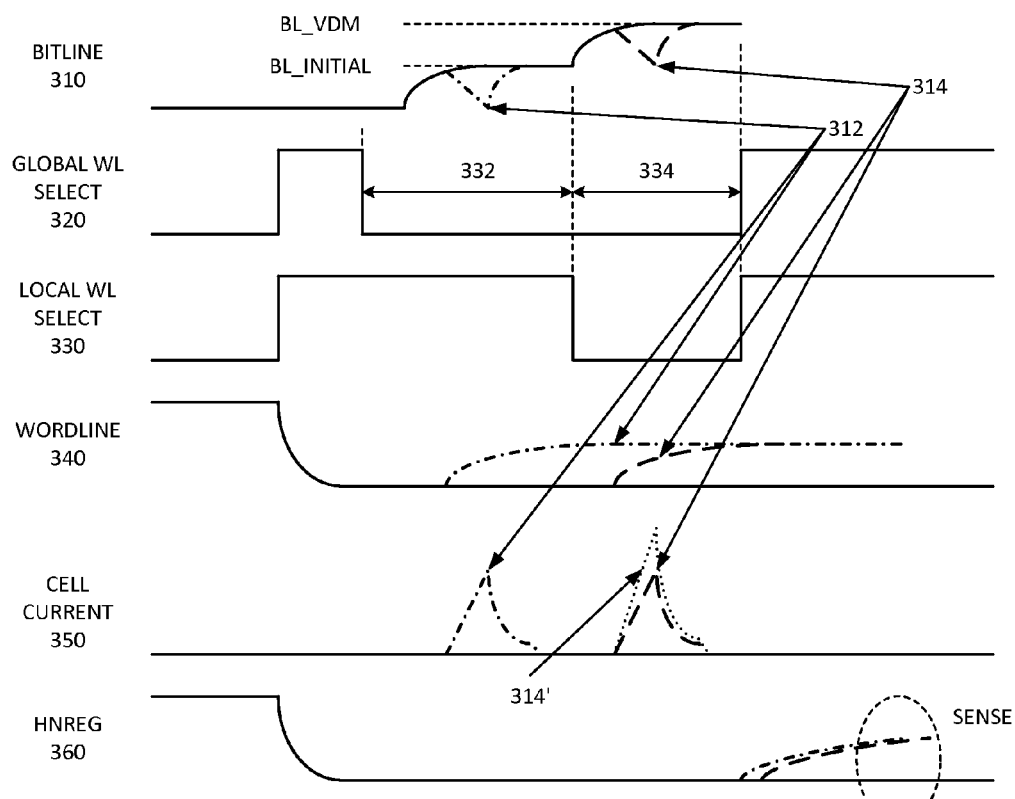
FIG. 3 is a diagrammatic representation of an embodiment of voltage waveforms in a system that performs a two-stage read operation.

FIG. 3 is a diagrammatic representation of an embodiment of voltage waveforms in a system that performs a two stage read operation. Diagram 300 represents various signals associated with a two stage read operation, and can be one example of an embodiment of diagram 200 of FIG. 2. System 100 can be one example of a system that performs a two stage read that can have signals similar to what are depicted in diagram 300.

A system can perform a multistage read (e.g., as depicted in diagram 200 or diagram 300) to enable lower worst case cell temperature during read for the same sense margin as compared to a traditional read. Alternatively, a system can perform a multistage read to (e.g., as depicted in diagram 200 or diagram 300) enable higher sense margin for the same worst case cell temperature during read as compared to a traditional read. Alternatively, a system can perform the multistage read to adjust both sense margin and worst case cell temperature.

In general, a multistage read dynamically adjusts the wordline capacitance with an increase in bitline voltage. Thus, a memory cell with lower Vt will trigger with a lower bitline voltage and a higher wordline capacitance. Triggering a memory cell refers to thresholding or passing the threshold voltage of the memory cell, which causes the memory to instantaneously turn on a conduct a relatively high amount of current before turning back off. A memory cell with a higher Vt will trigger later with a higher bitline voltage and a lower wordline capacitance. Thus, the multistage read can dynamically adjust wordline capacitance depending on the Vt of the memory cell being read. In one embodiment as in diagram 300, the system applies voltage across the memory cell during a read operation (i.e., Read) in two stages. In the first stage, the wordline capacitance is kept high and the system applies an initial bitline voltage. Low Vt memory cells trigger during this first stage. During the second stage, the system reduces the wordline capacitance. High Vt memory cells trigger during the second stage. As stated above, sense margin and cell temperature during read are a function of Vt of the memory cell and the wordline capacitance; the multistage read reduces or minimizes sense margin variation and/or cell temperature variation across different Vt. Reducing the variations across memory cells having different Vt can result in lower worst case cell temperature and/or higher worst case sense margin. In one embodiment, the operation represented in diagram 300 could be modified to a three-stage read by performing a bitline voltage ramp prior to floating the global wordline, and then ramping the bitline again as shown in diagram 300.

Specific signals shown in diagram 300 are bitline 310, global wordline select (GWLS) 320, local wordline select (LWLS) 330, wordline 340, cell current 350, and HNREG 350. Bitline 310, GWLS 320, and LWLS 330 are similar to corresponding signals represented in diagram 200, and the discussion of diagram 200 applies to these corresponding signals of diagram 300. Bitline 310 includes two separate bitline voltage stages, BL_Initial and BL_Vdm. In one embodiment, system control logic engages both GWLS 320 and LWLS 330, and then disengages GWLS 320. In one embodiment, the control logic ramps bitline 310 to BL_Initial after disengaging GWLS 320, during a period 332, which could be referred to as a "float global" period. As discussed above with respect to diagram 200, the disengaging signals on GWLS 320 and/or LWLS 330 could be ramped down (sloped) to gradually isolate the wordline from the particular driver.

In one embodiment, the control logic then disengages LWLS 330 to initiate period 334, which could be referred to as a "float local" period. During period 334 the control logic can ramp bitline 310 to BL_Vdm. BL_Vdm is a value selected by a system designer expected to trigger memory cells with a worst case Vt. BL_Initial is a value selected by the system designer expected to trigger a percentage of memory cells having lower than worst case Vt. It will be understood that Vt does not tend to be discrete, but a range of values, which can be triggered in two separate groups, one group in period 332, and the other group in period 334.

Wordline 340 illustrates voltage signals on the wordline. Cell current 350 represents the current seen through the memory cell. It will be seen that the wordline is initially charged, and the voltage on the wordline falls off when the wordline drivers are selected. Wordline 340 illustrates two possible additional curves. The first curve from left to right in diagram 300 is a dashed-dot line, which corresponds to the dashed-dot line in bitline 310, representing event 312, which is the triggering of a lower Vt memory cell. In bitline 310, the voltage can instantaneously drop from the value BL_Initial before recovering. The drop represents the bitline voltage curve if the memory cell triggers during period 332. If the memory cell triggers, there will be a corresponding increase in voltage on wordline 340, as charge is transferred during event 312. Cell current 350 represents a current spike through the memory cell as the cell is triggered with event 312 via bitline voltage 310, and it corresponds to the drop in voltage on bitline 310. Wordline 340 is charged by the triggering of the memory cell, and the wordline will hold its charge for later sensing.

The second curve from left to right on wordline 340 is a dashed line that represents the charging of wordline 340 from a memory cell with higher Vt, representing event 314, which is the triggering of a higher Vt memory cell. Thus, the dashed line in wordline 340 corresponds to the dashed line in bitline 310, where a memory cell triggers at higher voltage stage BL_Vdm, during period 334. Cell current 350 illustrates a current spike corresponding to event 314, in which current conducts instantaneously through the higher Vt memory cell. It will be observed that the current spike for event 314 is comparable in size to the current spike for event 312. For the sake of comparison, diagram 300 includes current spike 314', which represents a current spike of a higher Vt memory cell as would occur with a traditional single bitline voltage ramp-up. It will be observed that while the curves are not necessarily to scale, current spike 314' is larger than the current spike for either event 312 or event 314. By reducing the wordline capacitance in a multistage read, the current spike is controlled. Wordline 340 illustrates a corresponding dashed line illustrating the charging of the wordline with the triggering of the higher Vt memory cell in event 314. While two separate events, 312 and 314 are illustrated, it will be understood that memory cells can trigger anywhere in the ramping of bitline 310, and thus an actual implementation would not be limited to thresholding at the two events illustrated.

HNREG 360 represents an input to a sensing circuit or sensing amplifier. After applying the voltages for the multistage read, the control logic engages GWLS 320 and LWLS 330 to charge the sensing circuit input with the voltage on wordline 340. If the memory cell triggered with either event 312 or event 314, wordline 340 charges HNREG 360. The control logic can then sense the voltage on wordline 340 to determine the state of the memory cell (one or zero).

Figure 4:
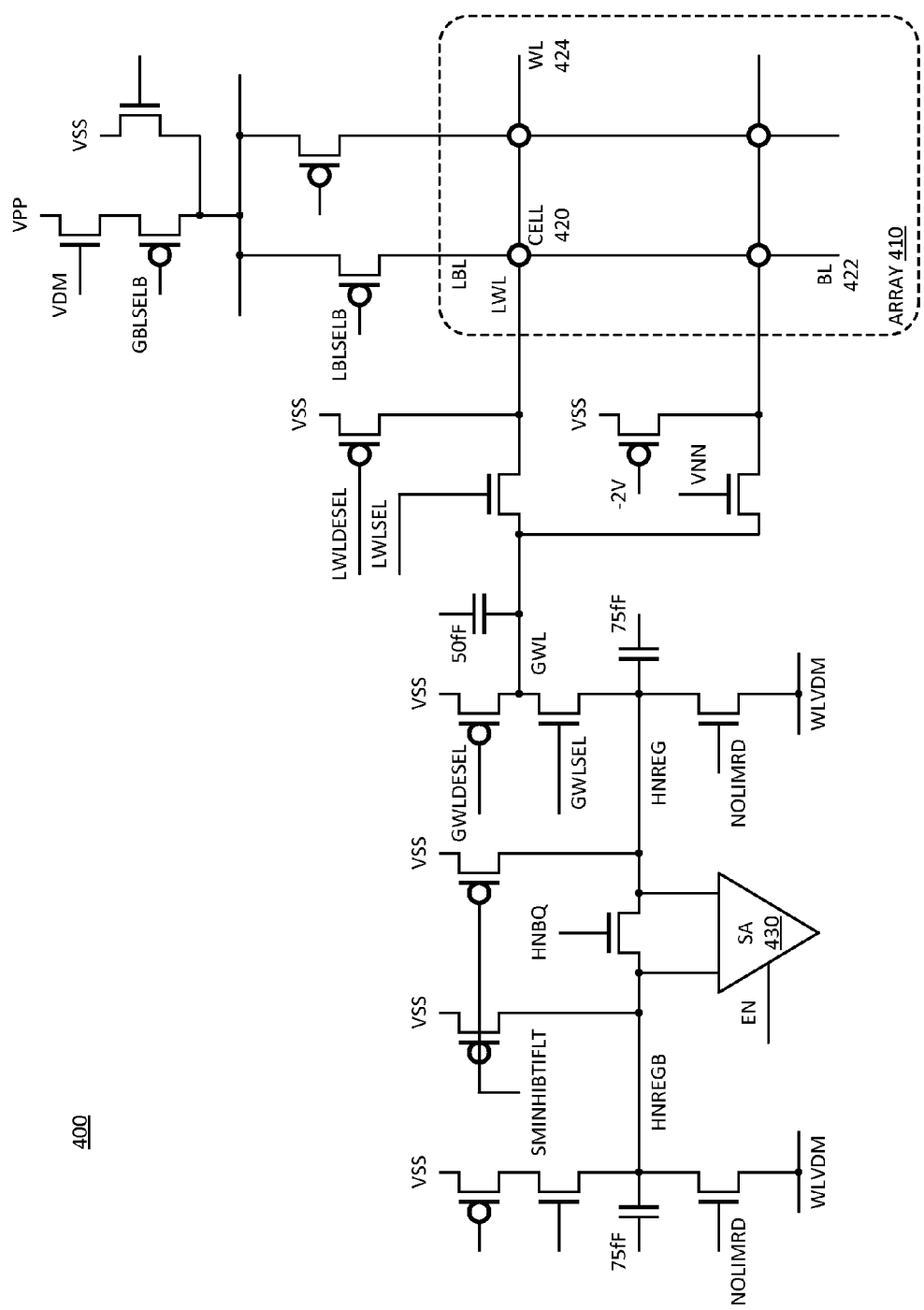
FIG. 4 is a circuit diagram representation of an embodiment of wordline and bitline drivers to provide multistage read operations.

FIG. 4 is a circuit diagram representation of an embodiment of wordline and bitline drivers to provide multistage read operations. Circuit 400 illustrates elements of control logic to perform a multistage read operation. Circuit 400 can represent one embodiment of circuit elements in accordance with system 100 of FIG. 1. Array 410 represents elements of a memory array that includes memory cell 420 at the intersection of bitline 422 and wordline 424. In one embodiment, array 410 includes phase change memory elements or other byte addressable memory technology. SA (sense amp) 430 represents a sensing circuit to read the voltage level of the memory cell and determine the state of the memory cell selected for read. Assume for purposes of the discussion below that memory cell 420 is selected for read. Thus, bitline 422 is the selected bitline, and wordline 424 is the selected wordline. The other wordlines can be deselected while reading cell 420.

Beginning first with the bitline control logic circuitry, in one embodiment, Vpp is a bitline high voltage, and Vdm drives a circuit element to provide a voltage desired on bitline 422 at cell 420. In one embodiment, signal Vdm provides multiple different voltage levels on bitline 422, such as by ramping Vpp. GBLSELB is a global bitline select signal, and LBLSELB is a local bitline select signal. Local bitline (LBL) is illustrated within array 410 by cell 420, and is a local bitline path that connects to the bitline. Other bitlines have similar circuit architecture.

The wordline control logic circuitry, in one embodiment, circuitry 400 includes a local wordline driver and a global wordline driver for wordline 424. Other wordlines will have similar architecture. In one embodiment, the local wordline driver is controlled by select signal LWLSEL (local wordline select) and deselect signal LWLDESEL (local wordline deselect). The local wordline is labeled as LWL and is illustrated within array 410, and corresponds to the local wordline path described above. LWLDESEL keeps the local wordline path grounded when not selected. The global wordline is labeled GWL and is illustrated on the other side of the local wordline driver, and can include a holding capacitor. GWL corresponds to the global wordline path described above, and applies to multiple wordlines (there will be multiple local wordlines for the global wordline). It will be understood that LWL and GWL can be considered separate nodes in circuitry 400. The global wordline driver can be controlled by a select signal GWLSEL (global wordline select). GWLDESEL keeps the global wordline path grounded when not selected. Thus, in one embodiment, the wordline has two levels of decoding, as shown by the GWL select signal and the LWL select signals. Thus, circuitry 400 can include decoding circuitry and/or control logic for a multistage read. It will be understood that while the local wordline path and the global wordline path are shown enabled and disabled by a two transistor architecture, circuitry 400 could be modified to have a single transistor enable/disable for either or both paths. In one embodiment, the architecture of circuitry 400 supports a two stage read or a three stage read. To provide a multistage read with more than three stages, additional circuit elements (e.g., an additional capacitor and an additional, separately selectable transistor) would need to be included in the global wordline driver circuitry. In one embodiment, the decoding circuitry is the same as the control logic for the multistage read. WLVDM represents a wordline voltage desired to be applied to wordline 424, such as a voltage to which the wordline is charged in preparation for a multistage read.

In one embodiment, the voltage level WLVDM is produced by a circuit architecture similar to what is shown for the bitline voltage source. NOLIMRD represents a select signal to pass the voltage WLVDM to the wordline. HNREG can also be considered a node in circuitry 400, and connects wordline 424 to a sensing circuit. The sensing circuit can be or include sense amplifier 430. SA 430 includes one or more enable signals (generically labeled as "EN" for enable). SMINHBITFLT represents an idle select signal, which can allow the system to start from a known state. HNBQ allows resetting the sense amplifier input lines.

Circuitry 400 can enable multistage operations as set forth above. In one embodiment, circuitry 400 generally operates to execute a multistage read on cell 420 at the intersection of wordline 424, bitline 422 as follows. The other wordline shown is deselected by applying −2V to a local deselect transistor of the other wordline, and applying signal VNN to the select transistor of the wordline. The system enables local and global selects (GWLSEL and LWLSEL are set to enable their respective driver circuit elements). The system can then generate a select signal to enable the circuit elements associated with NOLIMRD to charge wordline 424 to WLVDM. The system can then deselect NOLIMRD and deselect GWLSEL to float wordline 424 at the GWL node, or isolate wordline 424 from the driver at the GWL node. The system can enable VDM and GBLSELB and LBLSELB and begin to ramp Vpp as the global wordline floats. For a three stage read, the system can ramp Vpp prior to floating the global wordline. In one embodiment, the system can then deselect LWLSEL and float the local wordline or isolate wordline 424 from the driver at the LWL node, and ramp Vpp again. Whenever the bitline voltage potential reaches the threshold point for cell 420, the bitline voltage clears through the memory cell to wordline 424. After thresholding, cell 420 turns off. The system can then select GWLSEL and LWLSEL to charge HNREG from wordline 424. The system then enables SA 430 and compares HNREG to a reference voltage to see if the memory cell triggered. The output of SA 430 is not specifically shown, but will indicate whether or not the memory cell triggered.

Figure 5:
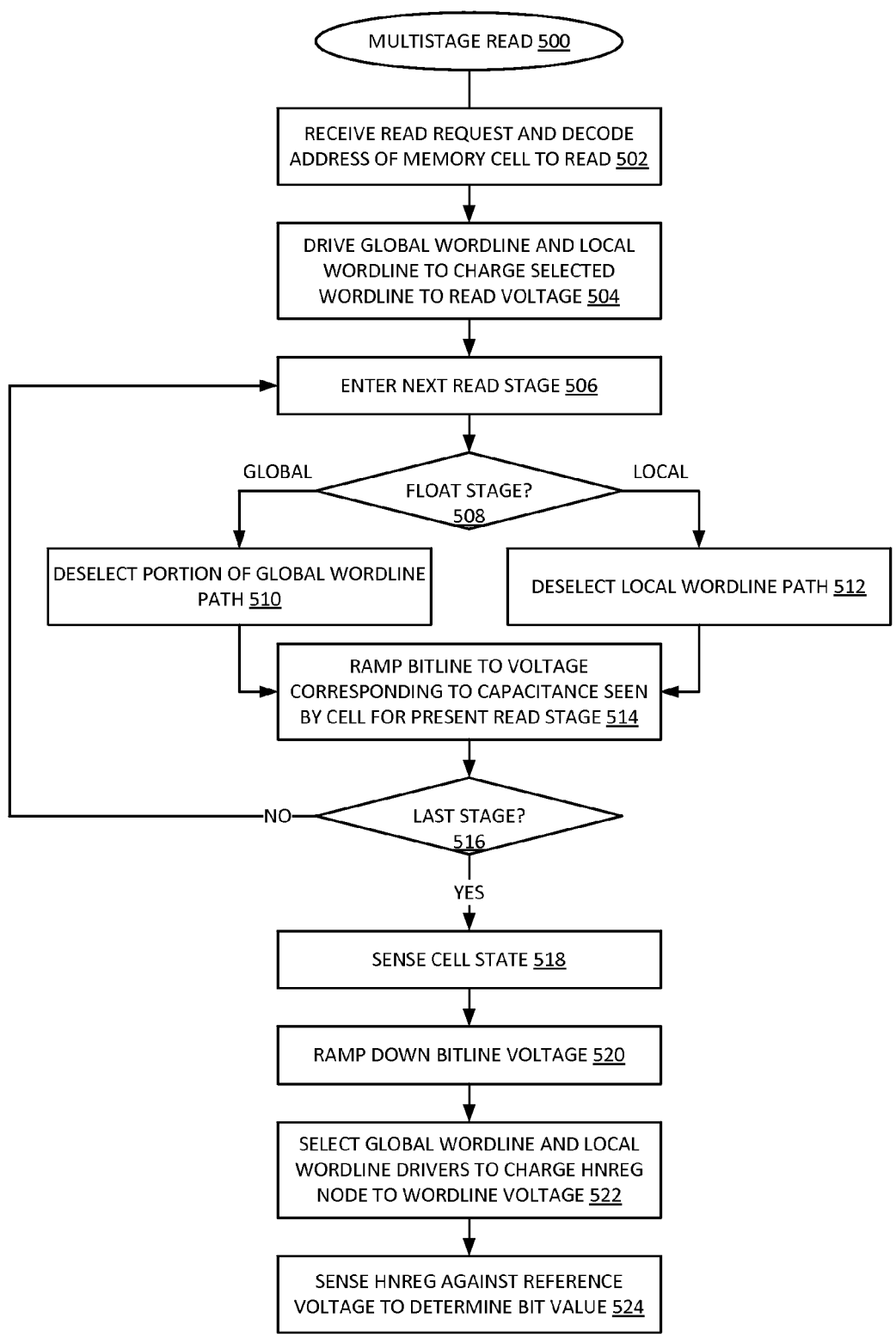
FIG. 5 is a flow diagram of an embodiment of a process for reading in multiple stages.

FIG. 5 is a flow diagram of an embodiment of process 500 for reading in multiple stages. In one embodiment, a system including a memory device and a processor to access data stored in the memory device, the processor generates a memory access command. In one embodiment, the memory device is a nonvolatile memory device that is byte addressable and can replace a traditional volatile memory device. The access command can be a read command.

The memory device receives the read request from the processor and decodes the address associated with the read request, which will include decoding the location of a memory cell selected to read, 502. The decoding includes identifying a bitline and wordline associated with the memory cell. In one embodiment, the control logic associated with the selected bitline and selected wordline drives the global wordline and local wordline to charge the wordline to a selected wordline read voltage, 504. The control logic can then selectively deselect the global wordline driver and the local wordline driver to isolate the wordline from the driver circuits. Each deselection of all or a portion of a wordline driver can be considered a read stage, 506.

In one embodiment, there can be more than one float global read stage in addition to a float local read stage. In one embodiment, there is one float global read stage and one float local read stage. In one embodiment, the control logic ramps the bitline before floating either the global wordline path or the local wordline path. Depending on the read stage, the control logic will float all or a portion of the global wordline path, 508 Global branch, or the local wordline path, 508 Local branch. For a global float stage, the control logic can deselect a portion of the global wordline path to isolate the wordline at a node on the global wordline path, 510. For a local float stage, the control logic can deselect the local wordline path to isolate the wordline at the local wordline path, 512. In one embodiment, the control logic performs all global float stages before entering any local float stages. In one embodiment, after either a global float stage or a local float stage, the control logic ramps up the bitline voltage while the wordline path is floating, 514. The control logic can ramp the bitline to different voltage levels corresponding to a capacitance seen by the memory cell for the present read stage. Thus, each read stage (whether global or local) has an associated capacitance (where the stages are entered sequentially in order of decreasing capacitance) and an associated bitline voltage (where each stage has an increasing bitline voltage level).

If the present read stage is not the last read stage corresponding to the last change in wordline capacitance and corresponding bitline voltage ramp, 516 NO branch, the control logic enters the next read stage, 506, and again changes the capacitance of the wordline by deselecting all or a portion of the wordline path and ramping up the bitline voltage. If the present read stage is the last stage, 516 YES branch, the control logic can sense the state of the memory cell, 518.

The control logic can ramp down the bitline voltage, 520. The control logic can select the global wordline driver and local wordline driver to charge the HNREG node to the wordline voltage, 522. The sensing circuit then senses HNREG against a reference voltage to determine the bit value of the selected memory cell, 524. In one embodiment, the sensing of cell state is performed at the end of each separate read stage, instead of once after all read stages.

Figure 6:
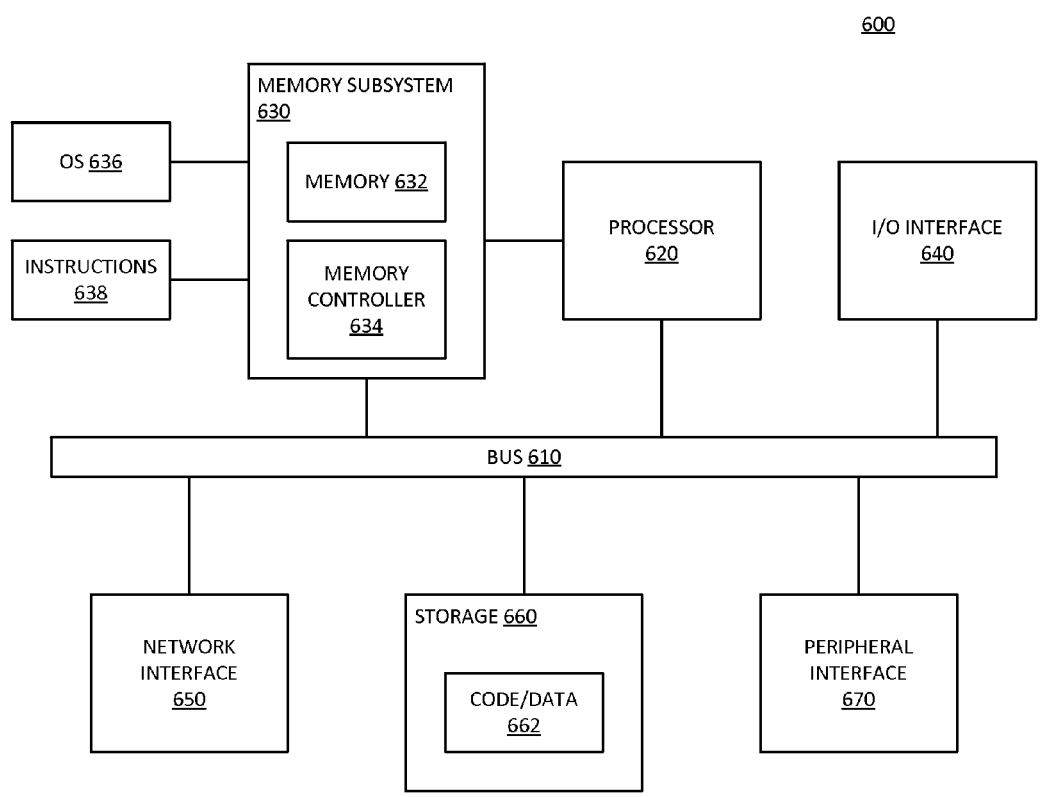
FIG. 6 is a block diagram of an embodiment of a computing system in which multistage reads can be implemented.

FIG. 6 is a block diagram of an embodiment of a computing system in which multistage reads can be implemented. System 600 represents a computing device in accordance with any embodiment described herein, and can be a laptop computer, a storage device, a desktop computer, a server, a gaming or entertainment control system, a scanner, copier, printer, routing or switching device, or other electronic device. System 600 includes processor 620, which provides processing, operation management, and execution of instructions for system 600. Processor 620 can include any type of microprocessor, central processing unit (CPU), processing core, or other processing hardware to provide processing for system 600. Processor 620 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 630 represents the main memory of system 600, and provides temporary storage for code to be executed by processor 620, or data values to be used in executing a routine. Memory subsystem 630 can include one or more memory devices such as read-only memory (ROM), flash memory, one or more varieties of random access memory (RAM), or other memory devices, or a combination of such devices. Memory subsystem 630 stores and hosts, among other things, operating system (OS) 636 to provide a software platform for execution of instructions in system 600. Additionally, other instructions 638 are stored and executed from memory subsystem 630 to provide the logic and the processing of system 600. OS 636 and instructions 638 are executed by processor 620. Memory subsystem 630 includes memory device 632 where it stores data, instructions, programs, or other items. In one embodiment, memory subsystem includes memory controller 634, which is a memory controller to generate and issue commands to memory device 632. It will be understood that memory controller 634 could be a physical part of processor 620.

Processor 620 and memory subsystem 630 are coupled to bus/bus system 610. Bus 610 is an abstraction that represents any one or more separate physical buses, communication lines/interfaces, and/or point-to-point connections, connected by appropriate bridges, adapters, and/or controllers. Therefore, bus 610 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 610 can also correspond to interfaces in network interface 650.

System 600 also includes one or more input/output (I/O) interface(s) 640, network interface 650, one or more internal mass storage device(s) 660, and peripheral interface 670 coupled to bus 610. I/O interface 640 can include one or more interface components through which a user interacts with system 600 (e.g., video, audio, and/or alphanumeric interfacing). Network interface 650 provides system 600 the ability to communicate with remote devices (e.g., servers, other computing devices) over one or more networks. Network interface 650 can include an Ethernet adapter, wireless interconnection components, USB (universal serial bus), or other wired or wireless standards-based or proprietary interfaces.

Storage 660 can be or include any conventional medium for storing large amounts of data in a nonvolatile manner, such as one or more magnetic, solid state, or optical based disks, or a combination. Storage 660 holds code or instructions and data 662 in a persistent state (i.e., the value is retained despite interruption of power to system 600). Storage 660 can be generically considered to be a "memory," although memory 630 is the executing or operating memory to provide instructions to processor 620. Whereas storage 660 is nonvolatile, memory 630 can include volatile memory (i.e., the value or state of the data is indeterminate if power is interrupted to system 600).

Peripheral interface 670 can include any hardware interface not specifically mentioned above. Peripherals refer generally to devices that connect dependently to system 600. A dependent connection is one where system 600 provides the software and/or hardware platform on which operation executes, and with which a user interacts.

In one embodiment, processor 620 executes operations on data stored in memory subsystem 630 and/or storage 660 (e.g., a solid state drive (SSD) using nonvolatile memory technology that can include byte addressable memory). The operation can include a memory access operation on a memory or storage device that can perform a multistage read in accordance with any embodiment described herein. The multistage read includes ramping up a bitline voltage of a selected memory cell to separate discrete voltage levels. In one embodiment, the system can ramp the bitline voltage in conjunction with controlling capacitance of the selected wordline. The multistage read allows the read operation to occur with improved sense margin and/or improved worst case current draw through the memory cell during the read operation.

Figure 7:
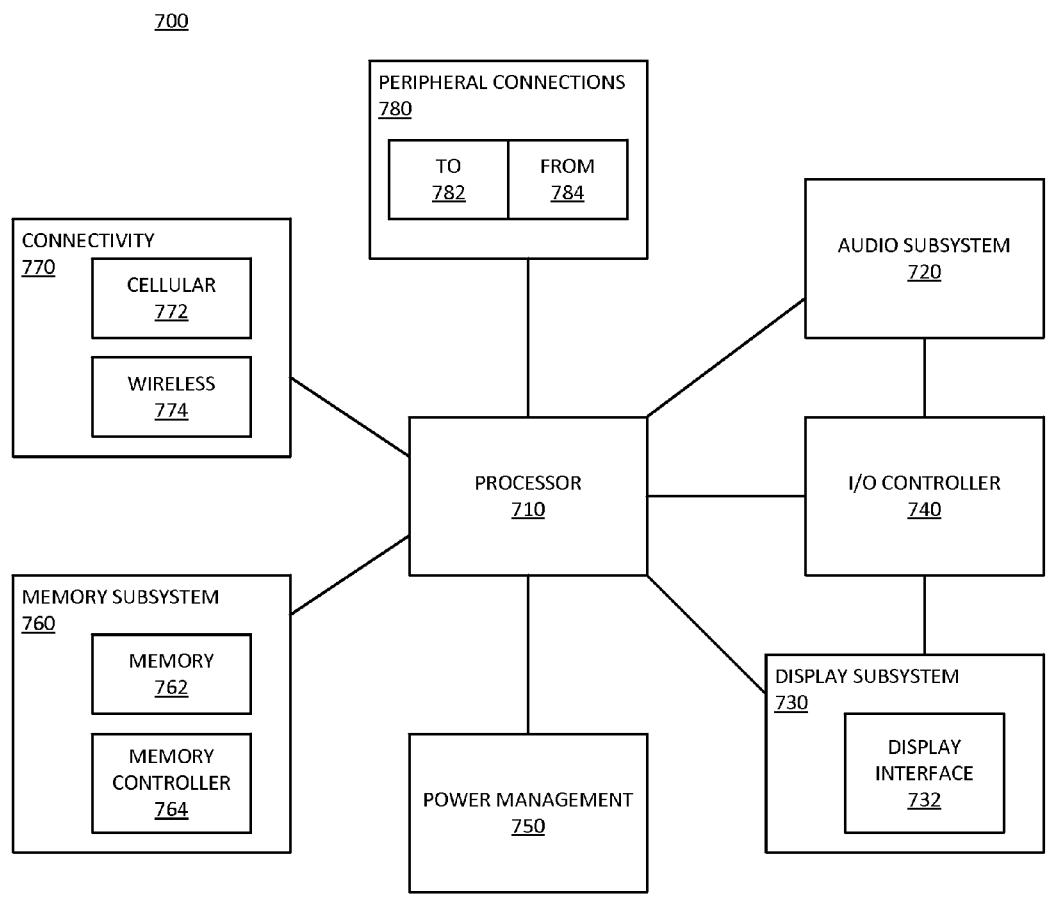
FIG. 7 is a block diagram of an embodiment of a mobile device in which multistage reads can be implemented.

FIG. 7 is a block diagram of an embodiment of a mobile device in which multistage reads can be implemented. Device 700 represents a mobile computing device, such as a computing tablet, a high-performance server, a mobile phone or smartphone, a wireless-enabled e-reader, wearable computing device, ultrabook, or other mobile device. It will be understood that certain of the components are shown generally, and not all components of such a device are shown in device 700.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations can also include operations related to audio I/O and/or display I/O.

In one embodiment, device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 700, or connected to device 700. In one embodiment, a user interacts with device 700 by providing audio commands that are received and processed by processor 710.

Display subsystem 730 represents hardware (e.g., display devices) and software (e.g., drivers) components that provide a visual and/or tactile display for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user.

I/O controller 740 represents hardware devices and software components related to interaction with a user. I/O controller 740 can operate to manage hardware that is part of audio subsystem 720 and/or display subsystem 730. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, gyroscopes, global positioning system (GPS), or other hardware that can be included in device 700. The input can be part of direct user interaction, as well as providing environmental input to the system to influence its operations (such as filtering for noise, adjusting displays for brightness detection, applying a flash for a camera, or other features). In one embodiment, device 700 includes power management 750 that manages battery power usage, charging of the battery, and features related to power saving operation.

Memory subsystem 760 includes memory device(s) 762 for storing information in device 700. Memory subsystem 760 can include nonvolatile (state does not change if power to the memory device is interrupted) and/or volatile (state is indeterminate if power to the memory device is interrupted) memory devices. Memory 760 can store application data, user data, music, photos, documents, or other data, as well as system data (whether long-term or temporary) related to the execution of the applications and functions of system 700. In one embodiment, memory subsystem 760 includes memory controller 764 (which could also be considered part of the control of system 700, and could potentially be considered part of processor 710). Memory controller 764 includes a scheduler to generate and issue commands to memory device 762.

Connectivity 770 includes hardware devices (e.g., wireless and/or wired connectors and communication hardware) and software components (e.g., drivers, protocol stacks) to enable device 700 to communicate with external devices. The external device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, processor 710 executes operations on data stored in memory subsystem 760 (e.g., a solid state drive (SSD) using nonvolatile memory technology that can include byte addressable memory). The operation can include a memory access operation on a memory or storage device that can perform a multistage read in accordance with any embodiment described herein. The multistage read includes ramping up a bitline voltage of a selected memory cell to separate discrete voltage levels. In one embodiment, the system can ramp the bitline voltage in conjunction with controlling capacitance of the selected wordline. The multistage read allows the read operation to occur with improved sense margin and/or improved worst case current draw through the memory cell during the read operation.

In one aspect, a method includes: charging a wordline of a memory device having a memory cell selected to read;

enabling a global wordline driver that connects a global wordline path from the wordline to a sensing circuit that reads the memory cell, and enabling a local wordline driver that connects a local wordline path to the global wordline path; disabling the global wordline driver and maintaining enabled the local wordline driver; applying an initial voltage to a bitline of the selected memory cell; disabling the local wordline driver and maintaining disabled the global wordline driver; applying a higher voltage to the bitline; and enabling the global wordline driver and the local wordline driver to connect the memory cell to the sensing circuit to read the selected memory cell.

In one embodiment, the memory cell comprises a phase change memory element. In one embodiment, the initial voltage and the higher voltage applied to the bitline have voltage levels determined based on expected threshold voltage distribution due to process variations for memory cells of the memory device. In one embodiment, applying the initial voltage further comprises applying multiple different discrete levels of voltage to the bitline prior to disabling the local wordline driver. In one embodiment, applying the higher voltage further comprises applying multiple different discrete levels of voltage to the bitline prior to enabling the global wordline driver and the local wordline driver. In one embodiment, disabling the global wordline driver and disabling the local wordline driver comprises dynamically changing capacitance of the wordline as seen at the memory cell. In one embodiment, the method further includes ramping the bitline voltage prior to disabling the global wordline driver and maintaining enabled the local wordline driver. In one embodiment, the method further includes enabling both the global wordline driver and the local wordline driver after applying the initial voltage to the bitline, to connect to the sensing circuit a read the memory cell after both applying the initial voltage to the bitline and after applying the higher voltage to the bitline.

In one aspect, a memory device having a memory cell between a wordline and a bitline, includes: a sensing circuit to read the memory cell when the memory cell is selected for a read operation; a wordline having an associated global wordline driver and a local wordline driver, the global wordline driver to selectively connect a global wordline path to the wordline and the local wordline driver to selectively connect a local wordline path to the global wordline path, wherein the wordline connects to the sensing circuit via the global wordline path and the local wordline path to read the memory cell; and a bitline having an associated bitline driver to selectively apply multiple voltage levels to the bitline; and logic to selectively enable and disable the global wordline driver and the local wordline driver, and to cause the bitline driver to apply a voltage level to the bitline; wherein the logic is to disable the global wordline driver while maintaining enabled the local wordline driver after the wordline is charged to a reading voltage, and wherein the logic is to cause the bitline driver to apply an initial voltage to the bitline while the global wordline driver is disabled and the local wordline driver is enabled; and wherein the logic is to further disable the local wordline driver and maintain disabled the global wordline driver, and wherein the logic is to cause the bitline driver to apply a second voltage to the bitline, higher than the initial voltage, while the global wordline driver and the local wordline driver are disabled.

In one embodiment, the memory cell comprises a phase change memory element. In one embodiment, the initial voltage and the second voltage applied to the bitline have voltage levels determined based on expected threshold voltage distribution due to process variations for memory cells of the memory device. In one embodiment, the logic is to cause the bitline driver to apply multiple different voltage levels including the initial voltage level to the bitline while the global wordline driver is disabled and the local wordline driver is enabled prior to the sensing circuit reading the memory cell. In one embodiment, the logic is to cause the bitline driver to apply multiple different voltage levels including the second voltage level to the bitline while the global wordline driver and the local wordline driver are disabled prior to the sensing circuit reading the memory cell. In one embodiment, the logic is to disable the global wordline driver and the local wordline driver to dynamically change capacitance of the wordline as seen at the memory cell. In one embodiment, the logic is further to ramp the bitline voltage prior to disabling the global wordline driver and maintaining enabled the local wordline driver. In one embodiment, the logic is further to enable the global wordline river and the local wordline driver after causing the bitline driver to apply the initial voltage to the bitline, to connect the memory cell to the sensing circuit to read the memory cell both after the bitline driver applies the initial voltage and after the bitline driver applies the second voltage.

In one aspect, an electronic device includes: a memory device with a memory cell between a wordline and a bitline to store data, the memory device including a sensing circuit to read the memory cell when the memory cell is selected for a read operation; a wordline having an associated global wordline driver and a local wordline driver, the global wordline driver to selectively connect a global wordline path to the wordline and the local wordline driver to selectively connect a local wordline path to the global wordline path, wherein the wordline connects to the sensing circuit via the global wordline path and the local wordline path to read the memory cell; and a bitline having an associated bitline driver to selectively apply multiple voltage levels to the bitline; and logic to selectively enable and disable the global wordline driver and the local wordline driver, and to cause the bitline driver to apply a voltage level to the bitline; wherein the logic is to disable the global wordline driver while maintaining enabled the local wordline driver after the wordline is charged to a reading voltage, and wherein the logic is to cause the bitline driver to apply an initial voltage to the bitline while the global wordline driver is disabled and the local wordline driver is enabled; wherein the logic is to further disable the local wordline driver and maintain disabled the global wordline driver, and wherein the logic is to cause the bitline driver to apply a second voltage to the bitline, higher than the initial voltage, while the global wordline driver and the local wordline driver are disabled; and a touchscreen display coupled to generate a display based on data accessed from the memory device.

In one embodiment, the memory cell comprises a phase change memory element. In one embodiment, the initial voltage and the second voltage applied to the bitline have voltage levels determined based on expected threshold voltage distribution due to process variations for memory cells of the memory device. In one embodiment, the logic is to cause the bitline driver to apply multiple different voltage levels including the initial voltage level to the bitline while the global wordline driver is disabled and the local wordline driver is enabled prior to the sensing circuit reading the memory cell. In one embodiment, the logic is to cause the bitline driver to apply multiple different voltage levels including the second voltage level to the bitline while the global wordline driver and the local wordline driver are disabled prior to the sensing circuit reading the memory cell.

In one embodiment, the logic is to disable the global wordline driver and the local wordline driver to dynamically change capacitance of the wordline as seen at the memory cell. In one embodiment, the logic is further to ramp the bitline voltage prior to disabling the global wordline driver and maintaining enabled the local wordline driver. In one embodiment, the logic is further to enable the global wordline river and the local wordline driver after causing the bitline driver to apply the initial voltage to the bitline, to connect the memory cell to the sensing circuit to read the memory cell both after the bitline driver applies the initial voltage and after the bitline driver applies the second voltage.

In one aspect, an article of manufacture comprising a computer readable storage medium having content stored thereon, which when executed performs operations for performing a multistage memory cell read, including: charging a wordline of a memory device having a memory cell selected to read; enabling a global wordline driver that connects a global wordline path from the wordline to a sensing circuit that reads the memory cell, and enabling a local wordline driver that connects a local wordline path to the global wordline path; disabling the global wordline driver and maintaining enabled the local wordline driver; applying an initial voltage to a bitline of the selected memory cell; disabling the local wordline driver and maintaining disabled the global wordline driver; applying a higher voltage to the bitline; and enabling the global wordline driver and the local wordline driver to connect the memory cell to the sensing circuit to read the selected memory cell.

In one embodiment, the memory cell comprises a phase change memory element. In one embodiment, the initial voltage and the higher voltage applied to the bitline have voltage levels determined based on expected threshold voltage distribution due to process variations for memory cells of the memory device. In one embodiment, the content for applying the initial voltage further comprises content for applying multiple different discrete levels of voltage to the bitline prior to disabling the local wordline driver. In one embodiment, the content for applying the higher voltage further comprises content for applying multiple different discrete levels of voltage to the bitline prior to enabling the global wordline driver and the local wordline driver. In one embodiment, the content for disabling the global wordline driver and disabling the local wordline driver comprises content for dynamically changing capacitance of the wordline as seen at the memory cell. In one embodiment, further comprising content for ramping the bitline voltage prior to disabling the global wordline driver and maintaining enabled the local wordline driver. In one embodiment, further comprising content for enabling both the global wordline driver and the local wordline driver after applying the initial voltage to the bitline, to connect to the sensing circuit a read the memory cell after both applying the initial voltage to the bitline and after applying the higher voltage to the bitline.

In one aspect, an apparatus for performing multistage memory cell read, includes: means for charging a wordline of a memory device having a memory cell selected to read; means for enabling a global wordline driver that connects a global wordline path from the wordline to a sensing circuit that reads the memory cell, and enabling a local wordline driver that connects a local wordline path to the global wordline path; means for disabling the global wordline driver and maintaining enabled the local wordline driver; means for applying an initial voltage to a bitline of the selected memory cell; means for disabling the local wordline driver and maintaining disabled the global wordline driver; means for applying a higher voltage to the bitline; and means for enabling the global wordline driver and the local wordline driver to connect the memory cell to the sensing circuit to read the selected memory cell.

In one embodiment, the memory cell comprises a phase change memory element. In one embodiment, the initial voltage and the higher voltage applied to the bitline have voltage levels determined based on expected threshold voltage distribution due to process variations for memory cells of the memory device. In one embodiment, the means for applying the initial voltage further comprises means for applying multiple different discrete levels of voltage to the bitline prior to disabling the local wordline driver. In one embodiment, the means for applying the higher voltage further comprises means for applying multiple different discrete levels of voltage to the bitline prior to enabling the global wordline driver and the local wordline driver. In one embodiment, the means for disabling the global wordline driver and disabling the local wordline driver comprises means for dynamically changing capacitance of the wordline as seen at the memory cell. In one embodiment, further comprising means for ramping the bitline voltage prior to disabling the global wordline driver and maintaining enabled the local wordline driver. In one embodiment, further comprising means for enabling both the global wordline driver and the local wordline driver after applying the initial voltage to the bitline, to connect to the sensing circuit a read the memory cell after both applying the initial voltage to the bitline and after applying the higher voltage to the bitline.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device having multiple memory cells disposed between respective wordlines and bitlines, comprising:
    a wordline driver to charge the respective wordline of a memory cell selected for a read operation;
    a bitline driver to apply multiple read voltages to the respective bitline of the selected memory cell, wherein a worst case thresholding voltage is expected for substantially all memory cells to cause a current to flow through the memory cell when the thresholding voltage is applied to respective bitlines of the memory cells, the bitline driver to
        apply a first read voltage of a voltage level lower than the worst case thresholding voltage to trigger a read of at least a portion of the memory cells; and
        ramp the read voltage to subsequently apply a second read voltage of a voltage level approximately equal to the worst case thresholding voltage to trigger a read of at least another portion of the memory cells; and
    a sensing circuit to read the memory cell when current flows through the memory cell.

2. The memory device of claim 1, wherein the memory cell comprises a phase change memory element.

3. The memory device of claim 1, wherein the voltage levels of the first read voltage and the second read voltage comprise voltage levels determined based on expected threshold voltage distribution due to process variations for the memory cells of the memory device.

4. The memory device of claim 1, further comprising the wordline driver to disable at least a portion of a wordline path without a discharge of the wordline while the bitline driver is to apply the multiple read voltages, and subsequently to enable the portion of the wordline path to enable the sensing circuit to read the memory cell.

5. The memory device of claim 1, further comprising the bitline driver to apply a third read voltage subsequent to application of the first read voltage and prior to application of the second read voltage, wherein the third read voltage of a voltage level higher than the voltage level of the first read voltage and lower than the voltage level of the second read voltage.

6. The memory device of claim 1, wherein the wordline driver further comprising a global wordline driver and a local wordline driver, wherein the global wordline driver is to connect the wordline to the sensing circuit, and wherein the local wordline driver is to connect the wordline to one or more capacitors.

7. The memory device of claim 6, further comprising the global wordline driver to disable a path to the sensing circuit, and the local wordline driver to connect to variable capacitance based on a read voltage applied by the bitline driver.

8. The memory device of claim 6, further comprising the global wordline driver to be disabled while the bitline driver is to apply the first read voltage, and while the local wordline driver is to be enabled; and subsequently, the global wordline driver to maintain disabled and the local wordline driver to be disabled while the bitline driver is to apply the second read voltage.

9. A method for reading a memory device, comprising:
    charging a wordline of a memory cell selected to read, wherein the memory cell is one of multiple memory cells of the memory device, each memory cell disposed between a wordline and a bitline, wherein a worst case thresholding voltage is expected for substantially all memory cells to cause a current to flow through the memory cell when the thresholding voltage is applied to respective bitlines of the memory cells for a read operation;
    applying a first read voltage to the bitline of the selected memory cell to trigger a read of at least a portion of the memory cells, the first read voltage of a voltage level lower than the worst case thresholding voltage; and
    ramping the read voltage to subsequently apply a second read voltage to the bitline of the selected memory cell to trigger a read of at least another portion of the memory cells, the second read voltage of a voltage level approximately equal to the worst case thresholding voltage.

10. The method of claim 9, wherein the memory cell comprises a phase change memory element.

11. The method of claim 9, wherein the voltage levels of the first read voltage and the second read voltage comprise voltage levels determined based on expected threshold voltage distribution due to process variations for the memory cells of the memory device.

12. The method of claim 9, further comprising:
    disabling at least a portion of a wordline path without a discharging the wordline and maintaining the portion of the wordline path disabled while applying the multiple read voltages; and
    subsequently enabling the portion of the wordline path to enable a sensing circuit to read the memory cell.

13. The method of claim 9, further comprising:
    applying a third read voltage subsequent to applying the first read voltage and prior to applying the second read voltage, wherein the third read voltage of a voltage level higher than the voltage level of the first read voltage and lower than the voltage level of the second read voltage.

14. The method of claim 9, wherein charging the wordline further comprises controlling the wordline with a global wordline driver and a local wordline driver, wherein the global wordline driver is to connect the wordline to the sensing circuit, and wherein the local wordline driver is to connect the wordline to one or more capacitors.

15. The method of claim 14, further comprising:

disabling the global wordline driver while maintaining the local wordline driver enabled, prior to applying the first read voltage; and subsequently, disabling the local wordline driver while maintaining the global wordline driver disabled, prior to applying the second read voltage.

16. An electronic device comprising:

a phase change memory device having multiple memory cells disposed between respective wordlines and bitlines, the memory device including a wordline driver to charge the respective wordline of a memory cell selected for a read operation;

a bitline driver to apply multiple read voltages to the respective bitline of the selected memory cell, wherein a worst case thresholding voltage is expected for substantially all memory cells to cause a current to flow through the memory cell when the thresholding voltage is applied to respective bitlines of the memory cells, the bitline driver to apply a first read voltage of a voltage level lower than the worst case thresholding voltage to trigger a read of at least a portion of the memory cells; and ramp the read voltage to subsequently apply a second read voltage of a voltage level approximately equal to the worst case thresholding voltage to trigger a read of at least another portion of the memory cells; and a sensing circuit to read the memory cell when current flows through the memory cell; and a touchscreen display coupled to generate a display based on data accessed from the memory device.

17. The electronic device of claim 16, wherein the voltage levels of the first read voltage and the second read voltage comprise voltage levels determined based on expected threshold voltage distribution due to process variations for the memory cells of the memory device.

18. The electronic device of claim 16, further comprising the wordline driver to disable at least a portion of a wordline path without a discharge of the wordline while the bitline driver is to apply the multiple read voltages, and subsequently to enable the portion of the wordline path to enable the sensing circuit to read the memory cell.

19. The electronic device of claim 16, further comprising the bitline driver to apply a third read voltage subsequent to application of the first read voltage and prior to application of the second read voltage, wherein the third read voltage of a voltage level higher than the voltage level of the first read voltage and lower than the voltage level of the second read voltage.

20. The electronic device of claim 16, wherein the wordline driver further comprising a global wordline driver and a local wordline driver, wherein the global wordline driver is to connect the wordline to the sensing circuit, and wherein the local wordline driver is to connect the wordline to one or more capacitors.

21. The electronic device of claim 20, further comprising the global wordline driver to disable a path to the sensing circuit, and the local wordline driver to connect to variable capacitance based on a read voltage applied by the bitline driver.

22. The electronic device of claim 20, further comprising the global wordline driver to be disabled while the bitline driver is to apply the first read voltage, and while the local wordline driver is to be enabled; and subsequently, the global wordline driver to maintain disabled and the local wordline driver to be disabled while the bitline driver is to apply the second read voltage.

\* \* \* \* \*